United States Patent
Linkewitsch et al.

(10) Patent No.: US 10,666,283 B2
(45) Date of Patent: May 26, 2020

(54) ANALOGUE-TO-DIGITAL CONVERTER CIRCUITRY COMPRISING CAPACITIVE SUCCESSIVE-APPROXIMATION CONTROL CIRCUITRY

(71) Applicant: SOCIONEXT INC., Yokohama-shi, Kanagawa (JP)

(72) Inventors: Niklas Linkewitsch, Braunschweig (DE); Charles Joseph Dedic, London (GB)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/244,003

(22) Filed: Jan. 9, 2019

(65) Prior Publication Data
US 2019/0229747 A1     Jul. 25, 2019

(30) Foreign Application Priority Data

Jan. 19, 2018  (EP) ...................................... 18152585

(51) Int. Cl.
*H03M 1/38* (2006.01)
*H03M 1/46* (2006.01)
*H03M 1/12* (2006.01)

(52) U.S. Cl.
CPC ......... *H03M 1/462* (2013.01); *H03M 1/1245* (2013.01); *H03M 1/46* (2013.01); *H03M 1/466* (2013.01)

(58) Field of Classification Search
CPC .............................. H03M 1/462; H03M 1/245
USPC .................. 341/161, 155, 144, 172
See application file for complete search history.

(56) References Cited

U.S. PATENT DOCUMENTS

| | | | |
|---|---|---|---|
| 6,879,277 B1* | 4/2005 | Cai | H03M 1/164 341/155 |
| 7,928,871 B2 | 4/2011 | Aruga et al. | |
| 8,264,389 B2* | 9/2012 | Farabegoli | H03M 1/1076 341/118 |
| 8,519,874 B2 | 8/2013 | Aruga et al. | |
| 9,628,237 B2* | 4/2017 | Kim | H04B 17/391 |
| 10,033,352 B2* | 7/2018 | Nicollini | G01C 25/005 |
| 2007/0052566 A1 | 3/2007 | Sutardja | |
| 2008/0297390 A1 | 12/2008 | Ko et al. | |
| 2010/0001892 A1 | 1/2010 | Aruga et al. | |
| 2011/0133963 A1* | 6/2011 | Kawai | H03M 1/0845 341/110 |
| 2012/0154193 A1 | 6/2012 | Chang et al. | |
| 2012/0319886 A1 | 12/2012 | Das et al. | |
| 2019/0229747 A1* | 7/2019 | Linkewitsch | H03M 1/1245 |

OTHER PUBLICATIONS

Extended European Search Report of related European Patent Application No. 18152585.8, dated Jul. 13, 2018.
Wang, W., et al., "A Digital Background Calibration Technique for Split DAC Based SAR ADC by Using Redundant Cycle", 28th IEEE International System-On-Chip Conference (SOCC), IEEE, pp. 231-234, Sep. 8, 2015.

* cited by examiner

*Primary Examiner* — Peguy Jean Pierre
(74) *Attorney, Agent, or Firm* — Arent Fox LLP

(57) ABSTRACT

The present invention relates to analogue-to-digital converter (ADC) circuitry. In particular, the present invention relates to ADC circuitry configured to use successive approximation to arrive at a multi-bit digital value representative of an analogue input value.

15 Claims, 9 Drawing Sheets

| Operation | Relative C | ΔV (*Vref) | Relative Weight |
|---|---|---|---|
| B1 | 29 | 0.5 | 14.5 |
| B2 | 16 | 0.5 | 8 |
| B3 | 9 | 0.5 | 4.5 |
| B4 | 5 | 0.5 | 2.5 |
| B5 | 3 | 0.5 | 1.5 |
| B6 | 2 | 0.5 | 1 |

| Operation | Relative C | ΔV (*Vref) | Relative Weight |
|---|---|---|---|
| B1 | 29 | 0.5 | 14.5 |
| B2 | 16 | 0.5 | 8 |
| B3 | 9 | 0.5 | 4.5 |
| B4 | 10 | 5/20 | 2.5 |
| B5 | 10 | 3/20 | 1.5 |
| B6 | 10 | 2/20 | 1 |

US 10,666,283 B2

ANALOGUE-TO-DIGITAL CONVERTER CIRCUITRY COMPRISING CAPACITIVE SUCCESSIVE-APPROXIMATION CONTROL CIRCUITRY

CROSS-REFERENCE TO RELATED APPLICATION

This application claims priority from European Patent Application No. 18152585.8 filed Jan. 19, 2018. The entire contents of the prior application are incorporated herein by reference.

The present invention relates to analogue-to-digital converter (ADC) circuitry. In particular, the present invention relates to ADC circuitry configured to use successive approximation to arrive at a multi-bit digital value representative of an analogue input value.

A successive approximation register (SAR) ADC typically uses a comparator in each of its successive approximation (sub-conversion) operations Successive-approximation conversion may be considered as one example of a conversion process which is made up of a sequence of such sub-conversion operations Such ADC circuitry (mixed-signal circuitry) may have particular use, for example, as the ADC circuitry (sub-ADC units) used at the ends of the paths in the sampling circuitry disclosed in EP-A1-2211468.

As background, therefore, to explore merely one potential application of circuitry of the present invention, aspects of the sampling circuitry disclosed in EP-A1-2211468 will now be considered.

FIG. 1 is a schematic diagram of overall analogue-to-digital circuitry 40, to which the present invention may be applied. Circuitry 40 comprises sampler 42, voltage-controlled oscillator (VCO) 44 as an example clock-signal generator, demultiplexers 46, ADC banks 48, digital unit 50 and calibration unit 52. It will become apparent that actual successive-approximation conversion takes place in the sub-ADC units (or ADC sub-units) of the ADC banks 48, and thus focus will be placed on these banks and their configuration later herein.

The sampler 42 is configured to perform four-way or four-phase time-interleaved so as to split the input current $I_{IN}$ by current steering into four time-interleaved sample streams A to D. For this purpose, VCO 44 is a quadrature VCO operable to output four clock signals 90' out of phase with one another, for example as four raised cosine signals. VCO 44 may for example be a shared 16 GHz quadrature VCO to enable circuitry 40 to have an overall sample rate of 64 GS/s.

Each of streams A to D comprises a demultiplexer 46 and an ADC bank 48 connected together in series as shown in FIG. 1. The sampler 42 operates in the current mode and, accordingly, streams A to D are effectively four time-interleaved streams of current pulses originating from (and together making up) input current $I_{IN}$, each stream having a sample rate one quarter of the overall sample rate. Continuing the example overall sample rate of 64 GS/s, each of the streams A to D may have a 16 GS/s sample rate.

Focusing on stream A by way of example, the stream of current pulses is first demultiplexed by an n-way demultiplexer 46. Demultiplexer 46 is a current-steering demultiplexer and this performs a similar function to sampler 42, splitting stream A into n time-interleaved streams.

The n streams output from demultiplexer 46 pass into ADC bank 48, which contains n ADC sub-units each operable to convert its incoming pulse stream into digital signals, for example into 8-bit digital values. Accordingly, n digital streams pass from ADC bank 48 to digital unit 50.

Streams B, C, and D operate analogously to stream A, and accordingly duplicate description is omitted. If n=80, circuitry 40 may be considered to comprise 320 ADC sub-units split between the four ADC banks 48.

Calibration unit 52 is connected to receive a signal or signals from the digital unit 50 and, based on that signal, to determine control signals to be applied to one or more of the sampler 42, VCO 44, demultiplexers 46 and ADC banks 48.

FIG. 2 is a schematic diagram useful for understanding the principle of operation of ADC banks 48. For simplicity, only one output 60 of the demultiplexers 46 is shown, and consequently the ADC circuitry 48 shown represents only the ADC circuitry (sub-ADC unit) required for that particular output. Similar ADC circuitry 48 (sub-ADC units) may be provided for all the outputs of the demultiplexers 46.

ADC circuitry 48 generally takes the form of a capacitance 150. As shown in FIG. 2, capacitance 150 may be variable in value, such that its value can be trimmed during calibration or during an initial setup phase. Generally speaking, capacitance 150 is employed to convert the current pulses from output 60 into voltage values $V_{OUT}$. That is, each pulse charges up capacitance 150 to a voltage proportional to the area of the pulse concerned. This is because the amount of charge in each current pulse is defined by its area (Q=∫Idt), and because the voltage across the capacitance 150 is defined by that amount of charge Q and the capacitance value C (V=Q/C).

The voltage $V_{OUT}$ for a particular pulse is held across capacitance 150 until the circuitry 48 is reset by reset switch 152. Whilst the voltage $V_{OUT}$ for a particular pulse is held, this analog output value can be converted into a digital output value, for example using an ADC circuit employing a successive-approximation register (SAR). In the case of differential circuitry, as may be the case for the FIG. 1 circuitry although not explicitly shown, each $V_{OUT}$ will have its complementary $V_{OUT}$, and the pair may be applied together to a differential comparator so that a single digital output for that pair is output.

An advantage of this mode of operation is that even if delays are experienced within the demultiplexers 46, the charge in each pulse will still make it to the relevant outputs, albeit over a slightly longer period. In that case, the voltage $V_{OUT}$ produced from the pulse remains unaffected. To illustrate this point, two examples 154 and 156 of the same current pulse are shown in FIG. 2. The first pulse 154 represents a case in which minimal delay is experienced. The second pulse 156 represents a case in which some delay/spreading is experienced, for example due to track capacitance in the circuitry. Consequently, pulse 156 is stretched in time as compared to pulse 154. Importantly, the area of the two pulses 154 and 156 is substantially the same, and thus the output voltage $V_{OUT}$ would be the same for both.

FIG. 3 is a schematic diagram useful for understanding a possible application of SAR—ADC (Successive Approximation Register—Analogue-to-Digital Conversion) circuitry within each sub-ADC unit of the circuitry 48 in FIG. 1. Such circuitry could have a cycle of sub-conversion operations (phases/steps) of the form Reset (R); Sample (S); 1; 2; 3; 4; 5; 6; 7 and 8, as shown in FIG. 3. In each Sample sub-conversion operation, a current pulse concerned may be converted into an output voltage $V_{OUT}$, and subsequently that voltage $V_{OUT}$ may be turned into an 8-bit digital value over the following 8 SAR sub-conversion operations. The next Reset sub-conversion operation then prepares the circuitry for the next current pulse.

FIG. 4 presents example SAR ADC circuitry which may be employed with the circuitry of FIGS. 1 and 2, i.e. as part of the sub-ADC units of the ADC banks 48, merely by way of further introduction to the general concept or SAR conversion. The main elements are a S/H (Sample/Hold—or sampler) circuit 170 to acquire $V_{OUT}$ from FIG. 2, a voltage comparator 180, an internal DAC 190 and an SAR 200. It will be appreciated that the arrangement of elements in FIG. 2 is a simple example to aid in an overview understanding of the functionality of SAR ADC circuitry. However, in other arrangements (where e.g. charge-redistribution techniques are used, with the DAC 190 being a capacitive DAC or CDAC), soma of the functionality of the elements (e.g. the S/H 170) may be provided as part of the functionality of another element (e.g. the DAC 190).

Continuing with FIG. 4, the comparator 180 compares the held $V_{OUT}$ with the output of the internal DAC 190 and outputs the result of the comparison to the SAR 200. The SAR 200 is designed to supply a digital code approximating to the internal DAC 190. The DAC 190 supplies the comparator with an analogue voltage based upon the digital code Input from the SAR 200.

The SAR 200 is initialised so that its MSB is equal to digital 1 (the other bits being digital 0). This code is then input to DAC 190, whose output analogue voltage is supplied to comparator 180. If this analogue voltage is greater than $V_{OUT}$ the comparator 180 causes SAR 200 to reset this bit; otherwise, the bit is kept as a 1. Then, the next bit is set to 1 and the same procedure (sub-conversion operation) is followed, continuing this binary search until every bit in the SAR 200 has been tested (these "tests" corresponding respectively to sub-conversion operations 1 to 8 in FIG. 3). The resulting digital code output from the SAR 200 is the digital approximation of the sample voltage VOUT and is finally output when the conversion is complete.

It will be apparent that each such "test" involves a comparison operation performed by the comparator. Typically, such sub-conversion operations are earned out synchronously, i.e. with each sub-conversion operation taking the same amount of time as regulated by a clock signal. This may mean that each sub-conversion has a "compare" period during which the necessary comparison is carried out, and at the end of which the result of the comparison is delivered to the surrounding circuitry. This "compare" period may then be followed by a "reset" period in which the comparator is readied for the next comparison, i.e. the next sub-conversion operation.

Continuing the general successive-approximation technique discussed in connection with FIG. 4, FIG. 5 is a schematic diagram of example SAR ADC circuitry 300 considered by the present inventors.

The ADC circuitry 300 comprises an analogue input terminal 310, a comparator 320 and successive-approximation control circuitry (which may be referred to simply as successive-approximation circuitry) 330. Also shown is a voltage reference source 360 which may be considered part of the successive-approximation control circuitry or generally part of the SAR ADC circuitry 300.

The analogue input terminal 310 is connected to receive an analogue input voltage signal (which may correspond to a charge pulse taken from an input control signal in line with FIGS. 1 and 2). Thus, $V_{IN}$ in FIG. 5 may correspond to $V_{OUT}$ in FIGS. 2 and 4.

The comparator 320 has first and second comparator-input terminals 322 and 324 and a comparator-output terminal 326, and is operable to generate a comparison result (e.g. a logic 1 or 0) at its comparator-out put terminal 326 based on a potential difference applied across the comparator-input terminals 322 and 324. The successive-approximation control circuitry 330 is configured to apply a potential difference across the first and second input terminals 322 and 324 based upon the input voltage signal $V_{IN}$ during the sample phase, and configured to control the potential difference for each of a series of successive-approximation operations through charge redistribution as will become apparent, the control applied m each successive-approximation operation being dependent on a comparison result generated by the comparator 320 in the preceding approximation operation.

As shown in FIG. 5, the successive-approximation control circuitry 330 comprises a SAR control unit 340, a charge reset switch 350, a plurality of capacitor switches 360 and a corresponding plurality of capacitors 370. The capacitors 370 have first and second capacitor terminals, their first terminals being connected to one of the comparator-input terminals 322 and 324, in this case terminal 324, and their second terminals being connected via respective capacitor switches 360 to the voltage reference source 380. Although not shown in detail to avoid over-complication, it will be understood that each capacitor switch 360 is operable to connect the second terminal of its capacitor 370 to either a $V_{ref}$ voltage supply, a GND voltage supply (i.e. 0V) or a $V_{mid}$ voltage supply being halfway in voltage level between the $V_{ref}$ and GND voltage levels, such that $V_{mid}=V_{ref}/2$. The charge reset switch 350 is connected in common to the first terminals of the capacitors 370 and is operable to connect them to e.g. the GND voltage supply (or, in general, some other voltage $V_1$) effectively to reset the amount of charge stored on the capacitors 370 to a reset or initial amount.

As also shown in FIG. 5, the SAR control unit 340 is connected to be controlled by the comparison result output from the comparator-output terminal 326 and is configured to control the charge reset switch 350 and the capacitor switches 360 by way of a control signal 342. Although not shown in FIG. 5, the SAR control unit 340 outputs the eventual digital output value representative of $V_{IN}$. It will be appreciated that the capacitors 370 in FIG. 5 are given example relative capacitance values 29C, 16C, 9C, 5C, 3C, 2C from top to bottom, so that their contribution to storing charge (absent any differences between the voltage differences across them) is weighted, in this case using a non-binary weighting system. That is, 16C is bigger than half of 29C, 9C is bigger than half of 16C, 5C is bigger than half of 9C and so on and so forth. For a binary weighting system the relative capacitance values from top to bottom might instead be 32C, 16C, 8C, 4C, 2C, C (perhaps with an additional C capacitor such that the total C value is 64C, or twice the largest value 32C). The advantage of using a non-binary weighting system as in FIG. 5 is that certain errors in the conversion process (e.g. due to the comparator not settling correctly in time) can be tolerated, and ultimately corrected for.

In operation, to convert a given analogue input voltage signal $V_{IN}$ into a representative digital output value, the input voltage signal $V_{IN}$ is applied to the comparator-input terminal 322 as shown, the capacitor switches 360 are all controlled to connect the second terminals of their capacitors 370 to $V_{mid}$, and the charge reset switch 350 is closed to reset the amount of charge stored on the capacitors 370 to an initial amount as mentioned above. In this state, the capacitors 370 all have the same potential difference across them, and thus the charge stored on them is weighted by their relative capacitance values. The charge reset switch 350 is then opened (with the capacitor switches left in their existing slate) and the amount of charge on the capacitors 370 is then effectively held with the potential difference between the capacitor-input terminals 322 and 324 dependent on $V_{IN}$ (and, indeed, equal to $V_{IN}-V_1$). This is the "start" state.

The successive-approximation operations then proceed one-by-one, each operation controlling a successive one of the capacitors 370 from the top (largest relative capacitance) to the bottom in FIG. 5. For convenience of explanation, the capacitors 370 and capacitor switches 360 will be numbered B1 to B6 from the top to the bottom in FIG. 5, as effectively corresponding to the first to sixth bits (from MSB to LSB) of the eventual (raw) digital output value. The successive operations will also be numbered B1 to B6 for similar reasons. Of course, the top-to-bottom ordering is schematic.

Thus, firstly in the B1 operation, the capacitor 320 outputs a comparison result in the start state. If the result is negative (logic 0), the B1 capacitor switch 360 is switched to GND to cause a $-\frac{1}{2} V_{ref}$ voltage change at the second terminal of the B1 capacitor 370, and the B1 bit of the raw digital output value is assigned value 0. If, however, the result is positive (logic 1), the B1 capacitor switch 360 is switched to $V_{ref}$ to cause a $+\frac{1}{2} V_{ref}$ voltage change at the second terminal of the B1 capacitor 370, and the B1 bit of the raw digital output value is assigned value 1. Either way, the switching of the B1 capacitor switch 370 causes the (fixed) total amount of charge stored on the capacitors 370 to be redistributed and the voltage level at the comparator-input terminal 324 (and thus the potential difference between the comparator-input terminals 322 and 324) to change accordingly. For the avoidance of doubt, the B2 to B6 capacitor switches 360 are not switched in this operation, and this general idea applies mutatis mutandis to the further operations. The next operation can then begin.

In the B2 operation, the comparator outputs a comparison result in the existing state. If the result is negative (logic 0), the B2 capacitor switch 360 is switched to GND to cause a $-\frac{1}{2} V_{ref}$ voltage change at the second terminal of the B2 capacitor 370, and the B2 bit of the raw digital output value is assigned value 0. If, however, the result is positive (logic 1), the B2 capacitor switch 360 is switched to $V_{ref}$ to cause a $+\frac{1}{2}V_{ref}$ voltage change at the second terminal of the B2 capacitor 370, and the B2 bit of the raw digital output value is assigned value 1. Again, the switching of the B2 capacitor switch 370 causes the charge stored on the capacitors 370 to be redistributed. The next operation can then begin.

In the B3 operation, the comparator outputs a comparison result in the existing state. If the result is negative (logic 0), the B3 capacitor switch 360 is switched to GND to cause a $-\frac{1}{2}V_{ref}$ voltage change at the second terminal of the B3 capacitor 370, and the B3 bit of the raw digital output value is assigned value 0. If, however, the result is positive (logic 1), the B3 capacitor switch 360 is switched to $V_{ref}$ to cause a $+\frac{1}{2}V_{ref}$ voltage change at the second terminal of the B3 capacitor 370, and the B3 bit of the raw digital output value is assigned value 1. Again, the switching of the B3 capacitor switch 370 causes the charge stored on the capacitors 370 to be redistributed.

The B4 to B6 operations continue one after the other in the same manner, and duplicate description can be omitted. At the end of the B1 to B6 operations, a final comparison can be carried out which may give a $7^{th}$ bit (i.e. B7) and thus the raw digital output value, e.g. 1011011, is produced. This value is referred to as a "raw" value since there may be some subsequent "correction" of this result in the SAR control unit 340 (or in other circuitry such as a processor connected thereto and not shown in FIG. 5), taking advantage of the benefits of the non-binary weighting system mentioned above to lead to a "corrected" digital output value.

It will be noticed that in each of the B1 to B6 operations, there is a change in voltage level $\Delta V$ of $\frac{1}{2}V_{ref}$ at the second terminal of the capacitor 370 for that operation. Thus, in charge terms, there could be considered to be a relative weighting between the operations B1 to B6 set by $\Delta V$ for that operation multiplied by the relative capacitance of the capacitor for that operation, ranging from 14.5 for B1 down to 1 for B6 as indicated in the table in FIG. 5. These weights make for a non-binary weighting system as discussed above. Of course, a binary weighting system could be applied in FIG. 5 with binary weighted relative capacitance values, but without the benefit of correction afforded by the non-binary weighting system. Here, "non-binary" maybe considered to mean that each successive value is more than half the previous one from successive operation to operation, so that the ratio R of me values (e.g. 29C/16C in capacitance values, or more importantly 14.5/8 in relative weights) satisfies 1<R<2 (more generally. R≠2 or R<2).

Looking at FIG. 5, the array of capacitors 370 and capacitor switches 360 may be referred to as a CDAC (capacitive DAC). Unfortunately, existing CDAC-based SAR ADC circuitry such as circuitry 300 of FIG. 5 has limited resolution because the smallest capacitor (with relative capacitance 2C in FIG. 5) may have a value close to the existing parasitic capacitances, which makes accurate capacitance modelling and fabrication difficult. This leads to limited ADC resolution. Coupled with this is a problem in that, particularly for the smallest capacitors, the necessary charging of the parasitic capacitances may inject a relatively high amount of unwanted noise into the reference voltage node (see $V_{ref}$ in FIG. 5).

Other aspects of the FIG. 5 circuitry are considered disadvantageous. For example, it has been found that the signal-to-noise ratio is too tow and that the performances otherwise not optimal.

It is desirable to solve some or all of the above problems.

According to an embodiment of a first aspect of the present invention, there is provided analogue-to-digital converter circuitry, comprising: an analogue input terminal, operable to receive an analogue input voltage signal; a comparator having first and second comparator-input terminals and operable to generate a comparison result based on a potential difference applied across these terminals; and successive-approximation control circuitry configured to apply a potential difference across the first and second comparator-input terminals based upon the input voltage signal, and configured to control the potential difference for each of a series of successive approximation operations through charge redistribution, the control applied in each successive approximation operation being dependent on a comparison result generated by the comparator in the preceding approximation operation, wherein: the successive-approximation control circuitry comprises at least two capacitors having first and second terminals, their first terminals wing connected to a said comparator-input terminal, at least one resistive potential divider connected between high and low reference voltage sources so as to provide a set of different voltage signals at tapping points defined therealong, and switching circuitry; and the successive-approximation control circuitry is configured such that: by controlling the switching circuitry in each of a series of N successive said approximation operations OPx, where x=1 to N, a voltage change is applied at the second terminal of at least one said capacitor which is equivalent to an equivalent voltage change ΔVx at the second terminal of an equivalent capacitor having an equivalent capacitance Cx, each approximation operation having a weight Wx defined by Cx*ΔVx: at least a sub-series of the series of approximation operations have a non-binary weight relationship in that the weight ratio from one of those approximation operations to the next Wx/Wx+1 is a non-binary ratio in that it is between 1 and 2; for each of the sub-series of approximation operations, the voltage change ΔVx for the approximation operation concerned is effected by controlling the switching circuitry to connect the second terminal of the at least one capacitor concerned from one tapping point along a said resistive potential divider to another tapping point along a said resistive potential divider; for at feast two of the sub-series of approximation operations, the voltage change ΔVx is effected by controlling the switching circuitry to connect the second terminal of the same at least one capacitor concerned from one tapping point along a said resistive potential divider to another tapping point along a said resistive potential divider; and for the sub-series of approximation operations, at least one ratio from the capacitance ratio from one of those approximation operations to the next Cx/Cx+1 and the voltage change ratio from one of those approximation operations to the next ΔVx/ΔVx+1 is a non-binary ratio.

The non-binary ratio may be considered to be a non-binary ratio in that it is not equal to 2 or less than 2. N could be 2, 3, 4 or any higher integer number. The sub-series of approximation operations could have 2, 3, 4 or any higher integer number of approximation operations less than N. The set of different voltage signals may comprise at least 4 different voltage signals.

The at least one resistive potential divider and the switching circuitry configured to connect to tapping points defined therealong may be referred to as a resistive DAC or RDAC.

The equivalent voltage change ΔVx and equivalent capacitance Cx may account for voltage changes being applied at the second terminal of more than one capacitor. For example, where there are two such capacitors to be considered, ΔVx*Cx may be equivalent to the product of the voltage change and the capacitance for the first capacitor plus the product of the voltage change and the capacitance for the second capacitor. Where there is only one such capacitor to be considered. ΔVx*Cx may be equivalent to the product of the voltage change and the capacitance for that capacitor Thus, ΔVx*Cx is a consideration of a change of charge stored on the capacitors.

The successive-approximation control circuitry may be configured such that: the approximation operations of the sub-series of approximation operations comprise applying the respective voltage changes ΔVx to the same at least one capacitor concerned, such that the capacitance ratio from one of those approximation operations to the next Cx/Cx+1 is 1; and a voltage change ratio from one of those approximation operations to the next ΔVx/ΔVx+1 is a non-binary ratio.

The successive-approximation control circuitry may be configured such that: each successive approximation operation of the sub-series of approximation operations comprises applying the voltage change ΔVx for that operation by connecting the at least one capacitor concerned from one particular tapping point to another. The particular tapping points may comprise: a starting tapping point; first and second first-tier tapping points whose voltage levels define a voltage difference ΔV1 above and be tow the voltage level of the starting tapping point, respectively; and first and second second-tier tapping points for each of the first-tier tapping points whose voltage levers define a voltage difference ΔV2 above and below the voltage level of the first-tier tapping point concerned. The ratio ΔV1/ΔV2 may be a non-binary ratio.

The particular tapping points may be arranged along a said resistive potential divider symmetrically about the starting tapping point in terms of their voltage levels. The resistive potential divider or dividers may be configured to have only the particular tapping points.

The successive-approximation control circuitry may be configured such that: each successive approximation operation of the sub-series of approximation operations comprises applying the voltage change ΔVx for that operation by connecting the at least one capacitor concerned from one tapping point to another along the same resistive potential divider as in the preceding approximation operation of the sub-series of approximation operations.

The successive-approximation control circuitry may be configured such that: for the sub-series of approximation operations, the successive approximation operations alternate between applying the voltage change ΔVx for the operation concerned to a first said capacitor or group of said capacitors having an overall capacitance C1 and to a second capacitor or group of said capacitors having an overall capacitance C2. A capacitance ratio C1/C2 may be a non-binary ratio. The successive approximation operations may alternate between applying the voltage changes ΔVx for those approximation operations by connecting each capacitor concerned from one particular tapping point to another along a said resistive potential divider, the particular tapping points being defined such that a voltage change ratio from one of those approximation operations to the next ΔVx/ΔVx+1 is a binary ratio in that it is 2.

In that case, the particular tapping points may comprise: a starting tapping point; first and second first-tier tapping points whose voltage levels define a voltage difference ΔV1 above and below the voltage level of the starting tapping point, respectively, and first and second second-tier tapping points for each of the first-tier tapping points whose voltage levels define a voltage difference ΔV2 above and below the voltage level of the first-tier tapping point concerned. The ratio ΔV1/ΔV2 may be a binary ratio. Further, the particular tapping points may be arranged along a said resistive potential divider symmetrically about the starting tapping point m terms of their voltage levels. The resistive potential divider used in the sub-series of operations may be the same resistive potential divider. The ratio of C1/C2 may be 1/√2.

The at least one resistive potential divider may be defined by resistors between its tapping points, wherein; each of the resistors has a resistance which is an integer multiple of a given resistance; and/or the resistors have the same resistance as one another; and/or at least one of the resistors is a variable resistor, and the control circuitry is configured to control the resistance of that resistor so as to tune the voltage signals provided at the tapping points; and/or at least one of the resistors is connected in parallel with a bypass circuit, and the control circuitry is configured to control the bypass circuit so as to short-circuit that resistor and tune the voltage signals provided at the tapping points.

The voltage change, in each of the series of N approximation operations OPx, may be applied at the second terminal of a single said capacitor or group of said capacitors all connected to a particular one of said comparator-input terminals.

The analogue input voltage signal may be a differential signal. In that case, the voltage change ΔVx, in each of the series of N approximation operations OPx, may be applied at the second terminal of a pair of corresponding single said capacitors or groups of said capacitors, one of the single capacitors or capacitor groups of the pair being connected to the first comparator-input terminal and the other of the single capacitors or capacitor groups of the pair being connected to the second comparator-input terminal. The voltage change, in each of the series of N approximation operations OPx, may thus be applied at the second terminal of corresponding capacitors, that voltage change amounting to the overall voltage change ΔVx at the second terminal of a capacitor having the capacitance Cx.

According to an embodiment of a second aspect of the present invention, there is provided analogue-to-digital converter circuitry, comprising: an analogue input terminal, operable to receive an analogue input voltage signal; a comparator having first and second comparator-input terminals and operable to generate a comparison result based on a potential difference applied across those terminals; and successive-approximation control circuitry comprising a digital-to-analogue converter and configured to apply a potential difference across the first and second comparator-input terminals based upon the input voltage signal, and further configured to control the potential difference for each of a series of successive approximation operations, wherein the successive-approximation control circuitry is configured to control the potential difference for each of the series of successive approximation operations so that a half-binary search is performed, the search being half binary in that across the series of successive approximation operations the search from one approximation operation to the next but one constitutes a binary search.

The digital-to-analogue converter may comprise a resistive digital-to-analogue converter comprising a resistive potential divider, where tapping points are defined along the resistive potential divider, the tapping points comprise particular tapping points which define voltages for the half-binary search, and the successive-approximation control circuitry is configured to selectively employ voltage signals provided at the particular tapping points in order to carry out the half-binary search.

The digital-to-analogue converter may comprise a capacitive digital-to-analogue converter comprising an array of capacitors, the capacitors may have respective capacitance values suitable for the half-binary search, and the successive-approximation control circuitry may be configured to selectively employ the capacitors in order to carry out the half-binary search.

According to an embodiment of a third aspect of the present invention, there is provided analogue-to-digital converter circuitry, comprising: an analogue input terminal, operable to receive an analogue input voltage signal, a comparator having first and second comparator-input terminals and operable to generate a comparison result based on a potential difference applied across those terminals: and successive-approximation control circuitry comprising a digital-to-analogue converter and configured to apply a potential difference across the first and second comparator-input terminals based upon the input voltage signal, and further configured to control the potential difference for each of a series of successive approximation operations, wherein: the successive-approximation control circuitry is configured to control the potential difference for each of the series of successive approximation operations so that a non-binary search is performed, the search being non-binary in that across the series of successive approximation operations the search or search range from one approximation operation to the next is weighted between 2:1 and 1:1; the digital-to-analogue converter comprises a resistive digital-to-analogue converter comprising a resistive potential divider; tapping points are defined along the resistive potential divider, the tapping points comprise particular tapping points which define voltage signals for the non-binary search; and the successive-approximation control circuitry is configured to selectively employ voltage signals provided at the particular tapping points in order to carry out the non-binary search.

The successive-approximation control circuitry may be configured to control the potential difference for each of the series of successive approximation operations so that a half-binary search is performed, the search being half-binary in that across the series of successive approximation operations the search or search range from one approximation operation to the next is weighted at $1/\sqrt{2}$; and the particular tapping points may define voltage signals for the half-binary search.

According to an embodiment of a fourth aspect of the present invention, there is provided integrated circuitry (such as an IC chip) comprising the analogue-to-digital converter circuitry of any of the aforementioned first to third aspects of the present invention.

The present invention extends to method or computer program aspects (e.g. for control) corresponding to the apparatus (circuitry) aspects.

Reference will now be made, by way of example only, to the accompanying figures, of which:

FIG. 1, considered above, is a schematic diagram of overall analogue-to-digital circuitry to which the present invention may be applied;

FIG. 2, considered above, is a schematic diagram useful for understanding the principle of operation of ADC banks of FIG. 1;

FIG. 3, considered above, is a schematic diagram useful for understanding a possible application of SAR-ADC circuitry within each sub-ADC unit of the FIG. 1 circuitry:

FIG. 4, considered above, presents example SAR ADC circuitry which may be employed with the circuitry of FIGS. 1 and 2;

FIG. 5, considered above, is a schematic diagram of example SAR ADC circuitry previously-considered by the present inventors;

Figure 6:
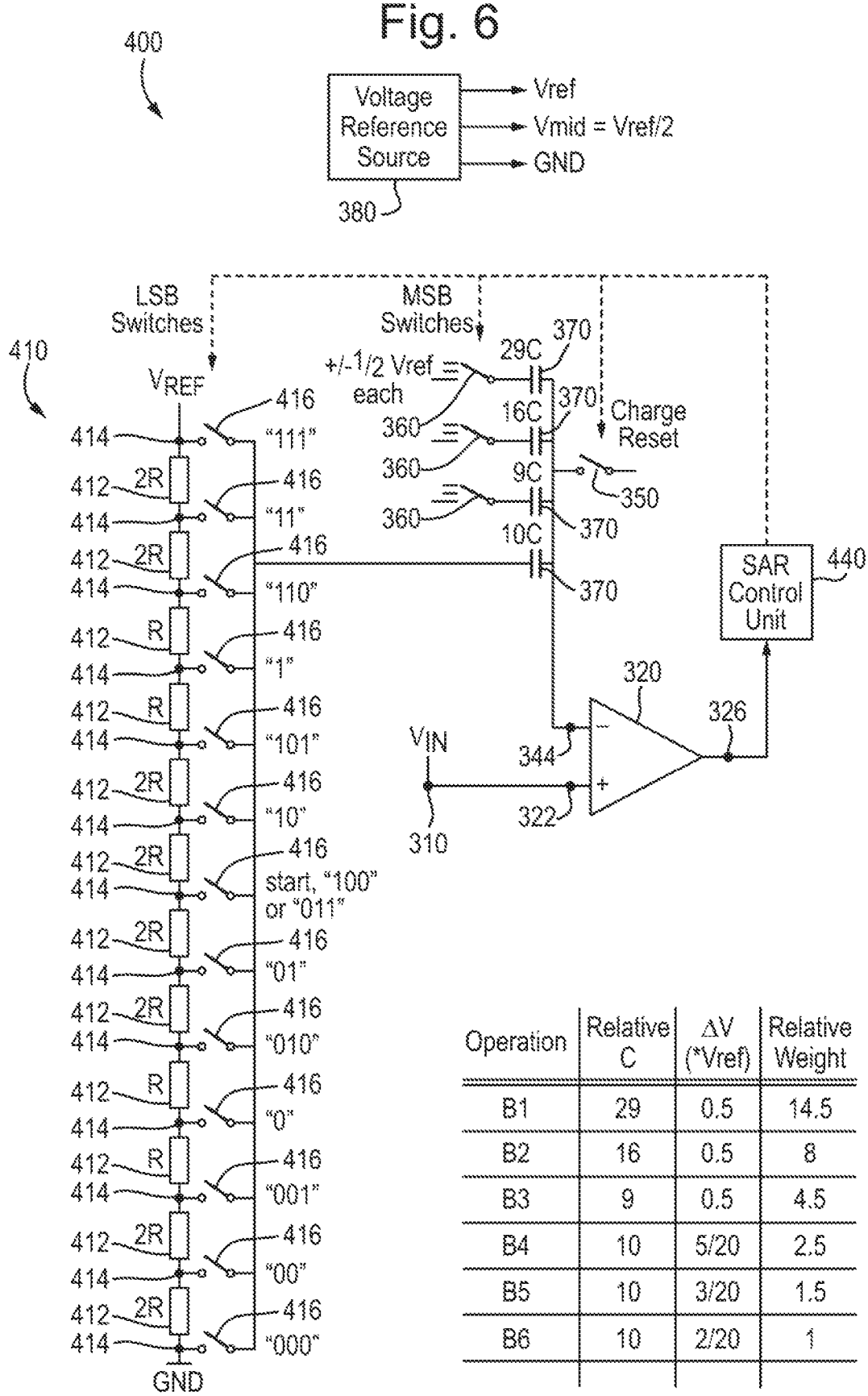
FIG. 6 is a schematic diagram of SAR-ADC circuitry embodying the present invention.

FIG. 6 is a schematic diagram of SAR ADC circuitry 400 embodying the present invention. For ease of explanation and understanding, certain elements of the SAR ADC circuitry 400 are the same as in the SAR ADC circuitry 300, and are denoted by the same reference numerals so that duplicate description may be omitted.

The main difference between the SAR ADC circuitry 400 and the SAR ADC circuitry 300 is that a resistive voltage divider 410 is provided, which comprises a plurality of resistors 412 connected in series between $V_{ref}$ and GND to define tapping points 414 therealong at which different voltage signals are produced. In the SAR ADC circuitry 400 the capacitors 370 with the relative capacitances 5C, 3C, 2C for the B4, B5 and B6 operations (as present in FIG. 5) have been replaced with a single capacitor 370 with relative capacitance 10C, which is then used for each of the B4, B5 and B6 operations. The second terminal of this capacitor 370 with relative capacitance 10C is then connected in parallel via a plurality of resistor switches 416 to respective tapping points 414 of the resistive potential divider 410. The SAR control unit 440 in FIG. 6 is then equivalent to the SAR control unit 340 in FIG. 5 except that it controls the resistor switches 416 in addition to the capacitor switches 370. It will become apparent that the capacitor switches 360 may be referred to as the MSB switches since the operations in which those switches are switched produce the MSBs of the digital output value, and the resistor switches 416 may be referred to as the LSB switches since the operations in which those switches are switched produce the LSBs of the digital output value.

Note that the resistors 412 which define the tapping points 414 have respective relative resistances 2R, 2R, R, R, 2R, 2R, 2R, 2R, R, R, 2R and 2R from $V_{ref}$ down to GND, such that the voltage levels at the tappng points 414 produce voltage signals which have voltage levels equal to a corresponding number of $20^{ths}$ of $V_{ref}$. This is indicated schematically in FIG. 7, which is useful for understanding the operation of the resistor switches 412 in conjunction with the resistive potential divider 410.

In operation, again the analogue input voltage signal $V_{IN}$ is applied to the comparator-input terminal 322 as shown, the capacitor switches 360 are all controlled to connect their capacitors 370 to W and the resistor switch 416 connected to the tapping point 414 in the middle of the resistive potential divider 410 in voltage terms and thus having a $V_{mid}=V_{ref}/2$ voltage level is turned on (with the other resistor switches 416 turned off), thereby also connecting the capacitor 370 with relative capacitance 10C to $V_{mid}$. The charge reset switch 350 is also closed. In this state, as in FIG. 5, the capacitors 370 all have the same potential difference across them. The charge reset switch 350 is then opened (leaving the other switches 360 and 416 in their existing states) leading to effectively the same start state as in FIG. 5.

Figure 1:
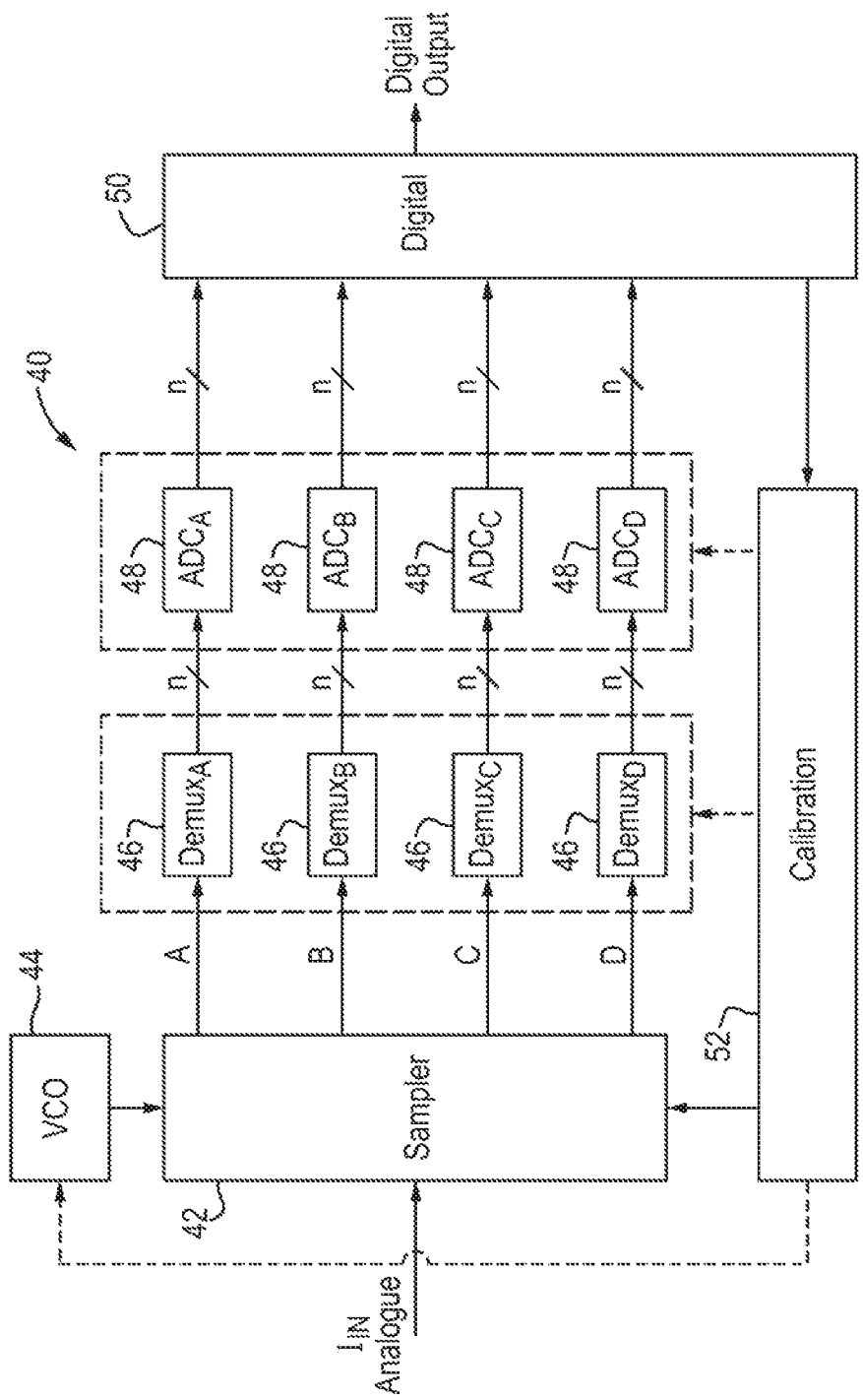
Figure 2:
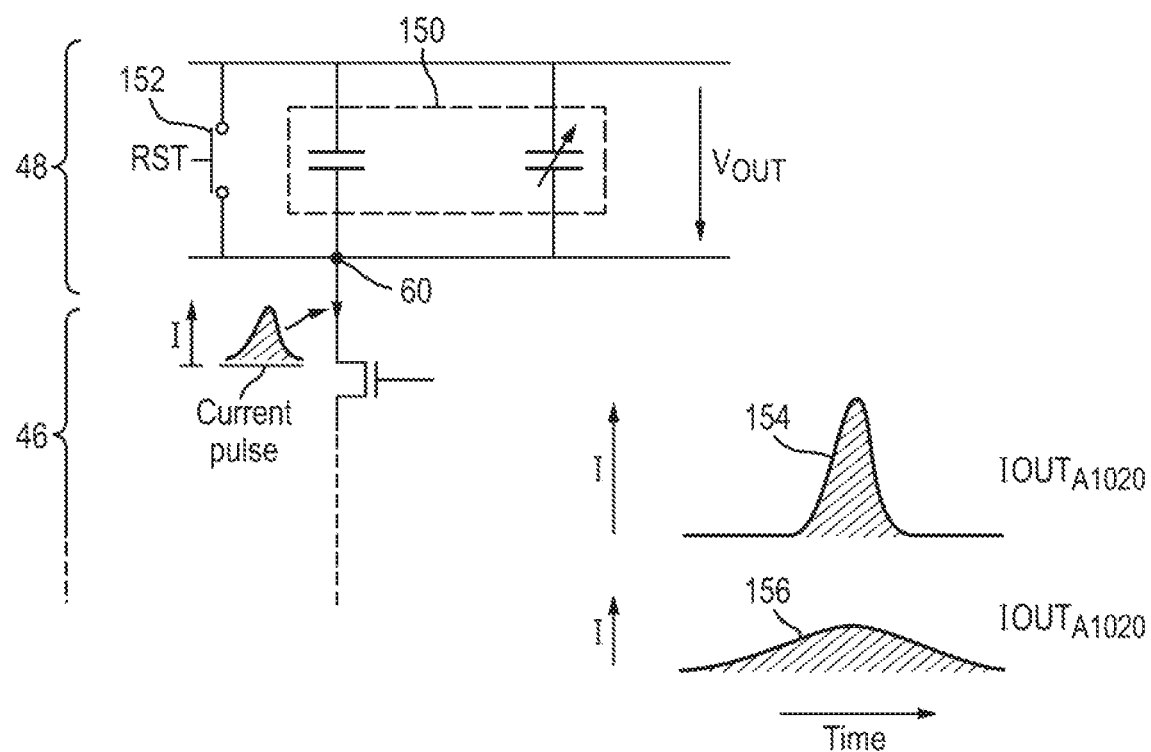
Figure 3:
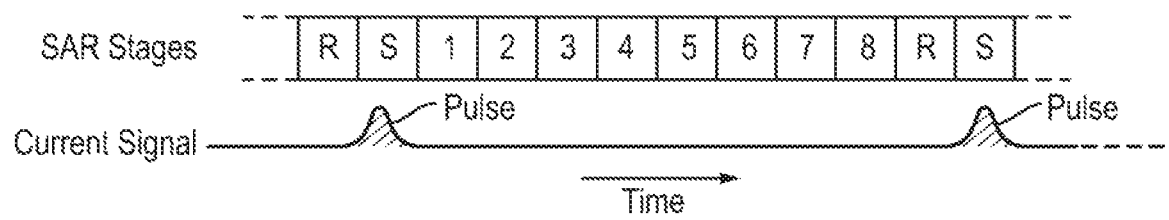
Figure 4:
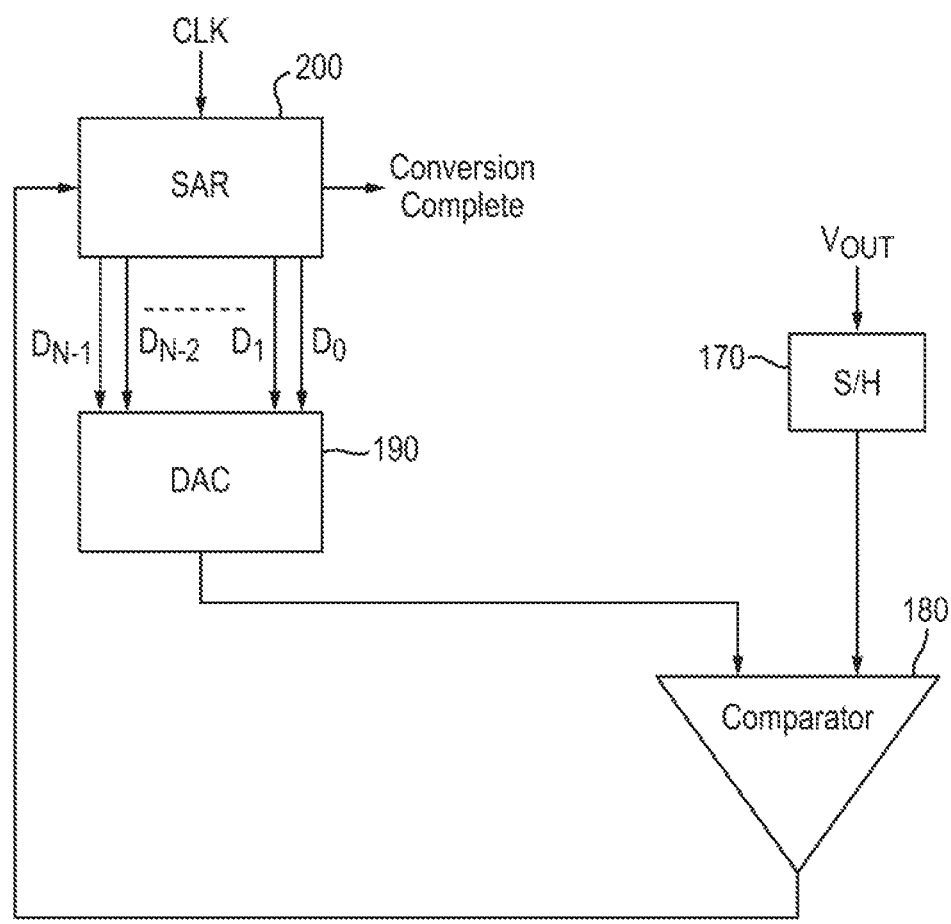
Figure 5:
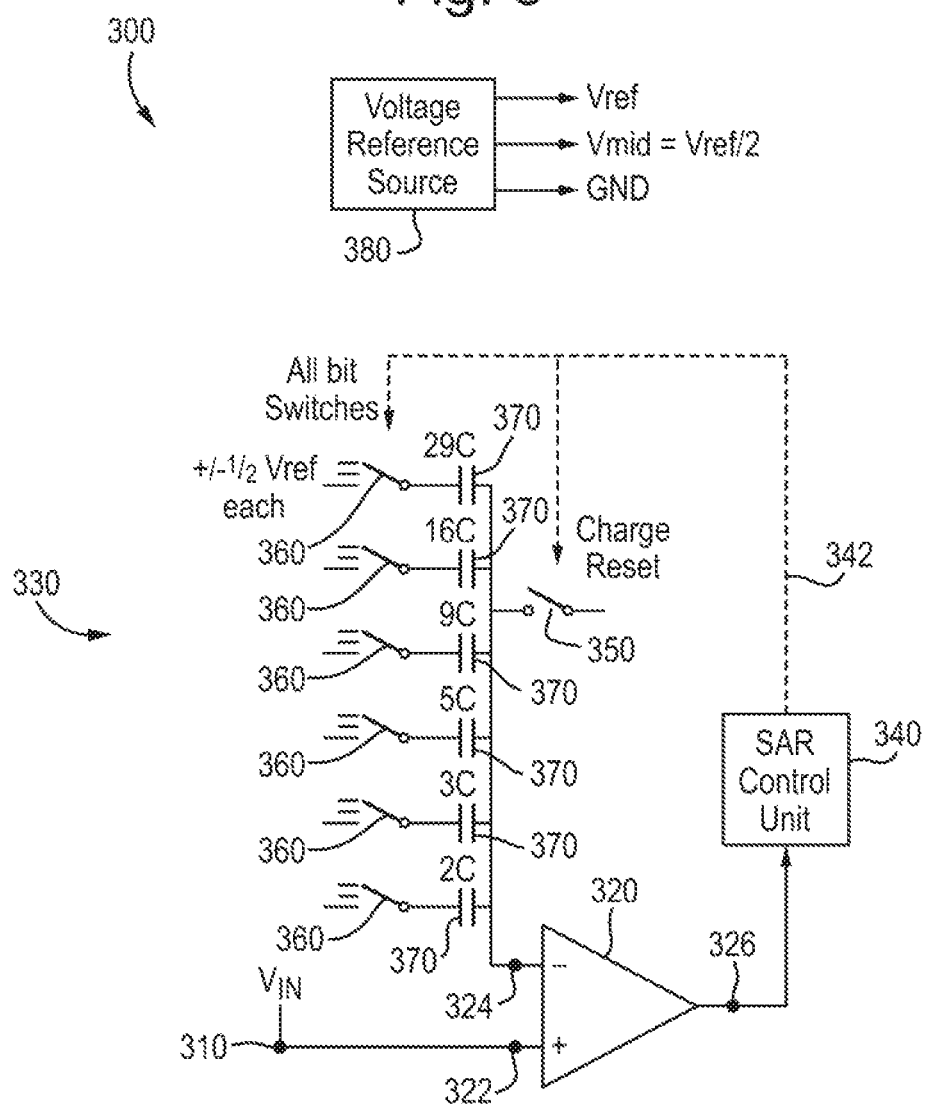

The successive-approximation operations then proceed one-by-one, with the operations B1 to B3 being the same as in FIG. 5. As indicated in FIG. 7, the resistor switch 416 connected to the tapping point 414 at 10/20 $V_{ref}$ (i.e. $V_{mid}$) is kept closed for operations B1 to B3.

In the B4 to B6 operations, control focus shifts from the capacitor switches 360 (which are then left in their existing states) to the resistor switches 416. The general idea is for one of the resistor switches to be closed and the others to be open at any one tone, so that the capacitor 370 with relative capacitance 10C is connected to a selected tapping point 414 (and thus voltage level) along the resistive potential divider 410. Which tapping point 414 is the selected tapping point 414 can then be changed to change the voltage level applied to the capacitor 370 with relative capacitance 10C.

Figure 7:
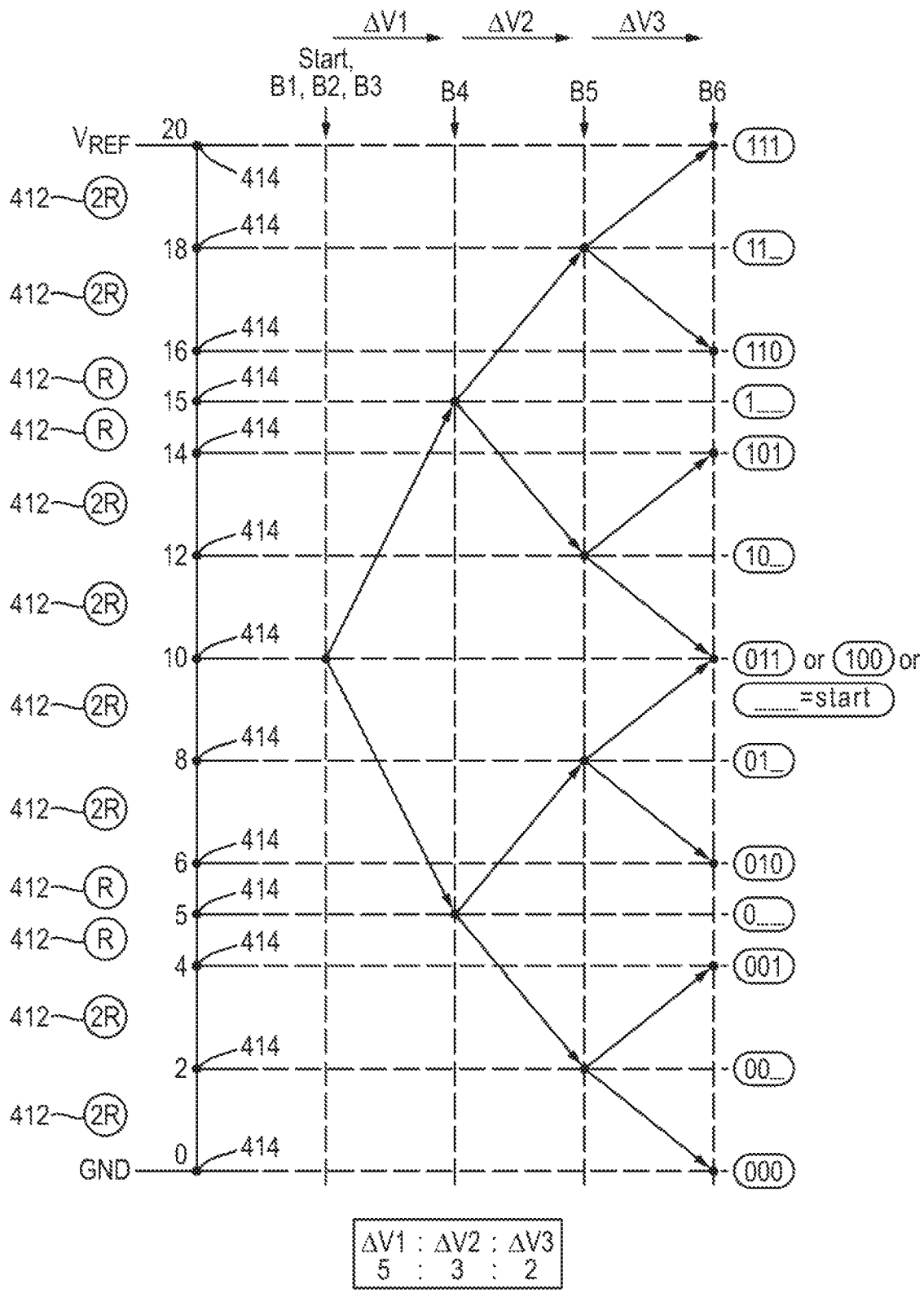
FIG. 7 is a schematic diagram useful for understanding the operation of the FIG. 6 circuitry.

In the B4 operation, the starting tapping point 414 is the one at 10/20 $V_{ref}$ (i.e. $V_{mid}$)—which has been maintained during operations B1 to B3 as mentioned above, and the capacitor 320 outputs a comparison result, if the result is negative (logic 0), the resistor switches 416 are controlled such that the selected tapping point 414 becomes the one at 5/20 $V_{ref}$ following the downward route in FIG. 7 from the starting point (and the B4 bit is assigned value 0) as indicated. If, on the other hand, the result is positive (logic 1), the resistor switches 416 are controlled such that the selected tapping point 414 becomes the one at 15/20 $V_{ref}$ following the upward route in FIG. 7 from the starting point instead (and the B4 bit is assigned value 1) as indicated. In either of these cases, the magnitude of the ΔV at the second terminal of the capacitor 370 with relative capacitance 10C is 5/20 $V_{ref}$. This is marked as ΔV1 in FIG. 7, although between operations rather than between GND and $V_{ref}$ to avoid complicating FIG. 7.

In the B5 operation, the starting tapping point 414 is the one at the end of the previous operation, end the comparator 320 outputs a comparison result. If the result is negative (logic 0), the resistor switches 416 are controlled such that the selected tapping point 414 becomes either the one at 12/20 or the one at 2/20 $V_{ref}$ following the relevant downward route in FIG. 7 from the previous position (and the B5 bit is assigned value 0) as indicated. If, on the other hand, the result is positive (logic 1), the resistor switches 416 are controlled such that the selected tapping point 414 becomes the one at either 18/20 $V_{ref}$ or the one at 8/20 $V_{ref}$ following one of the upward routes in FIG. 7 from the previous position (and the B5 bit is assigned value 1) as indicated. In any of these cases, the magnitude of the ΔV at the second terminal of the capacitor 370 with relative capacitance 10C is 3/20 $V_{ref}$. This is marked as ΔV2 in FIG. 7.

In the B6 operation, the starting tapping point 414 is the one at the end of the previous operation, and the comparator 320 outputs a comparison result. If the result is negative (logic 0), the resistor switches 416 are controlled such that the selected tapping point 414 becomes the one at 0/20 $V_{ref}$ or 6/20 $V_{ref}$ or 10/20 $V_{ref}$ or 16/20 $V_{ref}$ following one of the downward routes in FIG. 7 from the previous position (and the B6 bit is assigned value 0) as indicated. If, on the other hand, the result is positive (logic 1), the resistor switches 416 are controlled such that the selected tapping point 414 becomes the one at either 4/20 $V_{ref}$ or 10/20 $V_{ref}$ or 14/10 $V_{ref}$ or 20/20 $V_{ref}$ following one of the upward routes in FIG. 7 from the previous position (and the B6 bit is assigned value 1) as indicated. In any of these cases, the magnitude of the ΔV at the second terminal of the capacitor 370 with relative capacitance 10C is 2/20 $V_{ref}$. This is marked as ΔV3 in FIG. 7.

After the B6 operation, a final comparison can be carried out which may give a $7^{th}$ bit (i.e. B7) result as before, and again a raw digital output value is produced.

The relative capacitances and ΔV values for each of the operations B1 to B6 have been entered into the table in FIG. 6 (similar as to in FIG. 5) to indicate the relative weights for FIG. 6. It will be appreciated that the same relative weights are achieved in FIG. 6 as in FIG. 5, but without needing such small capacitor values. This is because the resistive potential divider 410 is used to provide successively smaller ΔV changes from operation to operation whilst the same capacitor 370 is employed. Indeed, from operations B3 to B6 the ratio of ΔV employed is 5:3.2 as indicated in FIG. 7 and also in the table in FIG. 6.

It will be appreciated that the resistive potential divider 410 with control as to which tapping point 414 is selected (i.e. "accessed") via the resistor switches 416 may be referred to as an RDAC (resistive-DAC).

In general, if the RDAC is used for L bits a maximum number of ($2^{L+1}-1$) tapping points are needed. This means that for the RDAC, all Intermediate switching positions (i.e. tapping points 414) that occur during the SAR algorithm (i.e. operations B4 to B6 in FIGS. 6 and 7) must be represented, and not only the end tapping point 414 after all of the bits are converted. However, there are examples where some states fall on the same tapping point 414 and indeed this holds as well for the example in FIGS. 6 and 7, which has only 13 tapping points 414 instead of 15. In FIGS. 6 and 7, the central position or tapping point 414 is shared with some end tapping points 414 (i.e. where the procedure may end up after the B6 operation). Due to exponential complexity (i.e. number) of RDAC tapping points 414 (in particular, switches 416) with increasing L, a higher number of bits L may require a separate capacitor 370 with its own resistive potential divider 410 so that each of these resistive potential dividers 410 can handle a lower L itself.

For example, in a hypothetical case where there are 4 bits (L=4) to be dealt with by way of a resistive potential divider 410 connected to capacitor 370, there could be instead a first capacitor 370 connected to a first resistive potential divider 410 dealing with two of those bits (i.e. L=2) and a second capacitor 370 connected to a second resistive potential divider 410 dealing with another two of those bits (i.e. L=2). Further, considering that the main function of the resistive potential divider (RDAC) is to provide set voltage levels at the tapping points, it will be appreciated that first and second sets of switches 416 could in this case share the same actual resistive potential divider 410 and this will became apparent from FIG. 8, which is also advantageous for other reasons. Incidentally, note that the tapping points in FIG. 6 are generated using resistors 412 whose resistances are an integer multiple of a "unit" resistance R.

Figure 8:
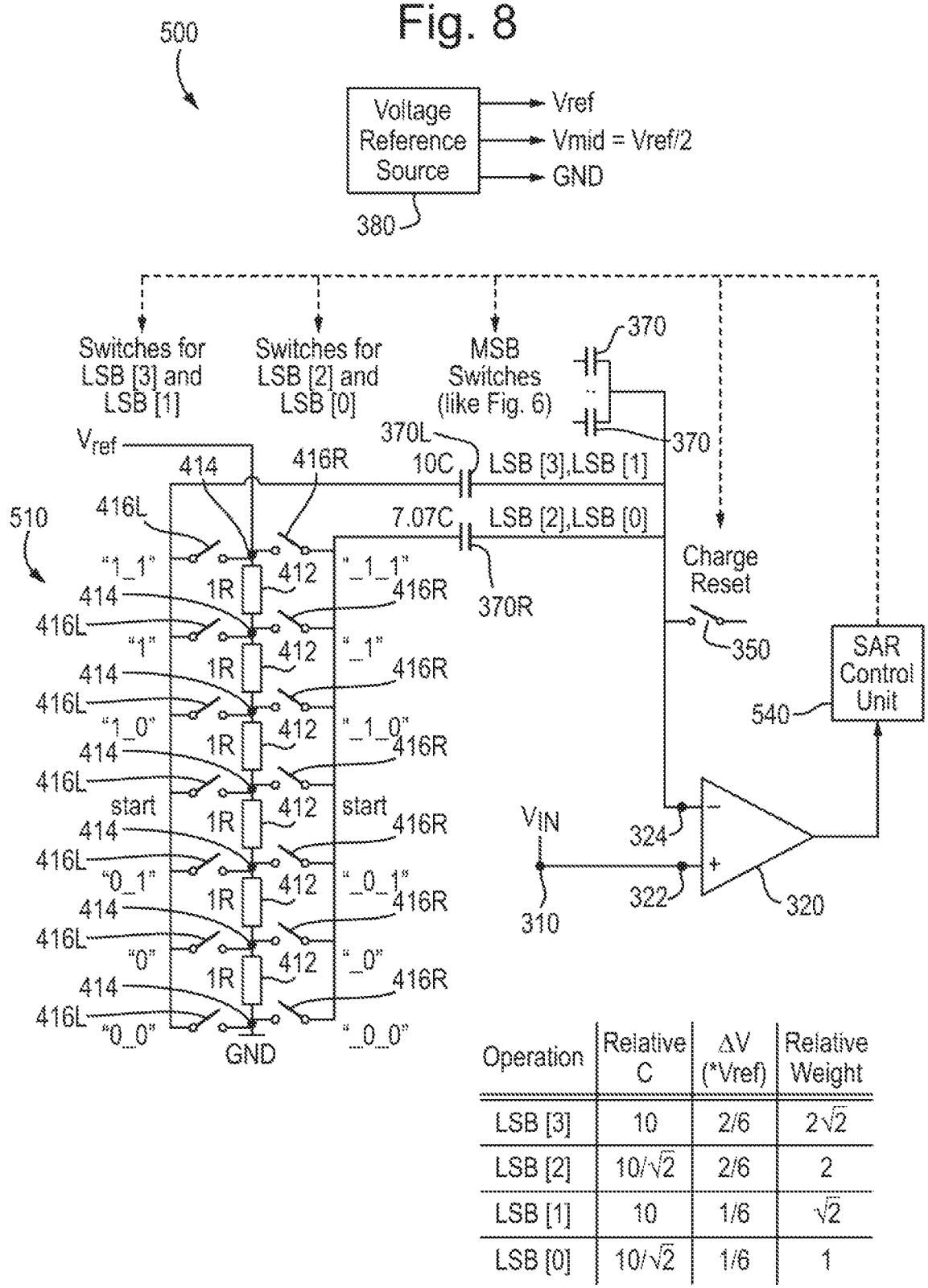
FIG. 8 is a schematic diagram of SAR ADC circuitry embodying the present invention.

FIG. 8 is a schematic diagram of SAR ADC circuitry 500 embodying the present invention. For ease of explanation and understanding, certain elements of the SAR ADC circuitry 500 are the same as in the SAR ADC circuitry 400, and are denoted with the same reference numerals so that duplicate description may be omitted. Also, certain elements present in both of SAR ADC circuitry 500 and 400 are omitted in FIG. 8 for simplicity.

The main difference between the SAR ADC circuitry 500 and the SAR ADC circuitry 400 is that in addition to the capacitor 370 with relative capacitance 10C mere is a capacitor 370 with relative capacitance 7.07C, which corresponds to (10C)/√2. These capacitors are labelled 370L (left-hand) and 370R (right-hand) for ease of explanation. The resistive potential divider 510 corresponds to the resistive potential divider 410 except that the number of resistors 412 and tapping points 414 is different, as are the relative resistances of the resistors 412. In FIG. 8, the resistors 412 all have the same relative resistance R.

As indicated in FIG. 8, the second terminal of the capacitor 370L (with relative capacitance 10C) is connected in parallel via a plurality of resistor switches 416L to respective tapping points 414 of the resistive potential divider 510 (shown connected from the left-hand side in FIG. 8) and, similarly, the second terminal of the capacitor 370R (with relative capacitance 7.07C) is connected in parallel via a plurality of resistor switches 416R to (the same) respective tapping points 414 of the resistive potential divider 510 (shown connected from the right-hand side in FIG. 8) The resistor switches 416R and 416L correspond to the resistor switches 416 in FIG. 6.

The SAR control unit 540 is then equivalent to the SAR control unit 440 in FIG. 6 except that it controls the resistor switches 416R and 416L separately. For ease of understanding, it is assumed that from a series of LSBs numbered from [3] to [0], where LSB [0] is the feast significant of those LSBs, the operations for LSB [3] and LSB [1] employ the resistor switches 416L and the capacitor 370L, and the operations for LSB [2] and LSB [0] employ the resistor switches 416R and the capacitor 370R. The table in FIG. 8 has been prepared similarly to the table in FIG. 6, but focussing only on the operations for LSB [3] to LSB [0] (labelled accordingly), and not showing entries for the MSBs which can be assumed to be the same as in FIG. 6. The capacitor switches 360 for the other capacitors 370 are also not shown but are assumed to be present as indicated in FIG. 8.

As the six resistors 412 in FIG. 8 all have relative resistance R, the voltage levels at the tapping points 414 in FIG. 8 produce voltage signals which have voltage levels equal to a corresponding number of $6^{ths}$ of $V_{ref}$. This is apparent from the ΔV entries in the table in FIG. 8.

In operation, again the analogue input voltage signal $V_{IN}$ is applied to the comparative-input-terminal 322 as shown, the capacitor switches 360 (not shown) are all controlled to connect their capacitors 370 (shown in simplified form) to $V_{mid}$, and the resistor switch 416L and the resistor switch 416R for $V_{mid}$ are closed, thereby also connecting the capacitors 370L and 370R to $v_{mid}$ leading to the same start state as in FIG. 6 (and FIG. 5).

The successive-approximation operations then proceed one-by-one with the operations B1 to B3 being the same as in FIG. 5 and FIG. 6 and are not focussed on here. The operations LSB [3] to LSB [0] are then similar to operations B4 to B6 in FIG. 6 except that there are four of them and in that they alternate between using capacitor 370L and capacitor 370R. This is indicated in FIG. 8.

In the LSB [3] operation, the starting tapping point 414 is the one at 3/6 $V_{ref}$ (i.e. $V_{mid}$) which has been maintained during operations B1 to B3, and the comparator 320 outputs a comparison result. If the result is negative (logic 0), the resistor switches 416L are controlled such that the selected tapping point becomes the one at 1/6 $V_{ref}$.

If, on the other hand, the result is positive (logic 1), the resistor switches 416L are controlled such that the selected tapping point 414 becomes the one at 5/6 $V_{ref}$. In either case, the magnitude of the ΔV at the second terminal of the capacitor 370L is 2/6 $V_{ref}$.

In the LSB [2] operation, the starting tapping point 414 is also the one at 3/6 $V_{ref}$ (i.e. $V_{mid}$) which has been maintained during operations B1 to B3, and the comparator 320 outputs a comparison result. It the result is negative (logic 0), the resistor switches 416R are controlled such that the selected tapping point becomes the one at 1/6 $V_{ref}$. If, on the other hand, the result is positive (logic 1), the resistor switches 416R are controlled such that the selected tapping point 414 becomes the one at 5/6 $V_{ref}$. Again, in either case, the magnitude of the ΔV at the second terminal of the capacitor 370R is 2/6 $V_{ref}$.

In the LSB [1] operation, the starting tapping point 414 is the one at the end of the LSB [3] operation, and the comparator 320 outputs a comparison result. If the result is negative (logic 0), the resistor switches 416L are controlled such that the selected tapping point 414 becomes the one at 4/6 $V_{ref}$ or the one at 0/6 $V_{ref}$. If, on the other hand, the result is positive (logic 1), the resistor switches 416L are controlled such that the selected tapping point becomes the one at 6/6 $V_{ref}$ or the one at 2/6 $V_{ref}$. In either case, the magnitude of the ΔV at the second terminal of the capacitor 370L is 1/6 $V_{ref}$.

In the LSB [0] operation, the starting taping point 414 is the one at the end of the LSB [2] operation, and the comparator 320 outputs a comparison result. If the result if negative (logic 0), the resistor switches 416R are controlled such that the selected tapping point 414 becomes the one at 0/6 $V_{ref}$ or the one at 4/6 $V_{ref}$. If, one the other hand, the result is positive (logic 1), the resistor switches 416R are controlled such that the selected tapping point 414 becomes the one at 2/6 $V_{ref}$ or the one at 6/6 $V_{ref}$. In any of these cases, the magnitude of the ΔV at the second terminal of the capacitor 370R is 1/6 $V_{ref}$.

Similarly to before, after the LSB [0] operation a final comparison can be performed which may give a further bit result.

Looking at the table in FIG. 8, or at the resistances of the resistors 412 and the capacitances of the capacitors 370L and 370R in FIG. 8, it can be seen that the resistive potential divider 510 with its tapping points 414 gives two interleaved binary-weighted systems, i.e. the ΔV drops from 2/6 to 1/6 $V_{ref}$ in an interleaved fashion from LSB [3] to LSB [0]. However, because the capacitances of the capacitors 370L and 370R are non-binary weighted (i.e. the ratio 10C: 10C/√2 is 1/√2, which satisfies 1<ratio<2), the overall relative weight structure is non-binary as in the table in FIG. 8. Incidentally, the re alive weights in FIG. 8 have been set using 1 as the lowest weight to show the 1/√2 (1 divided by the square root of 2) relationship dearly.

Thus, in FIG. 8 (as in FIG. 6) the relatively small capacitors 370 with relative capacitances 5C, 3C and 2C as in FIG. 5 are avoided. Also, to reduce the total number of tapping points 414 and resistor switches 416L and 416R, the operations for four of the LSBs are carried out using two capacitors (370L and 370R) and a shared resistive potential divider 510. Still further, the weighting ratio 1/√2 is advantageous as it corresponds to an even spacing of a logarithmic scale (with twice as many operations as for a binary search) leading to considerably optimum non-binary SAR ADC conversion, as explained later.

It will incidentally be appreciated that such a half-binary search could be achieved with the FIG. 6 circuitry, albeit with the resistance values of the resistors 412 and/or the number of tapping points 414 arranged differently to obtain appropriate voltage levels at the tapping points so that the relative weights have a half-binary structure.

Figure 9:
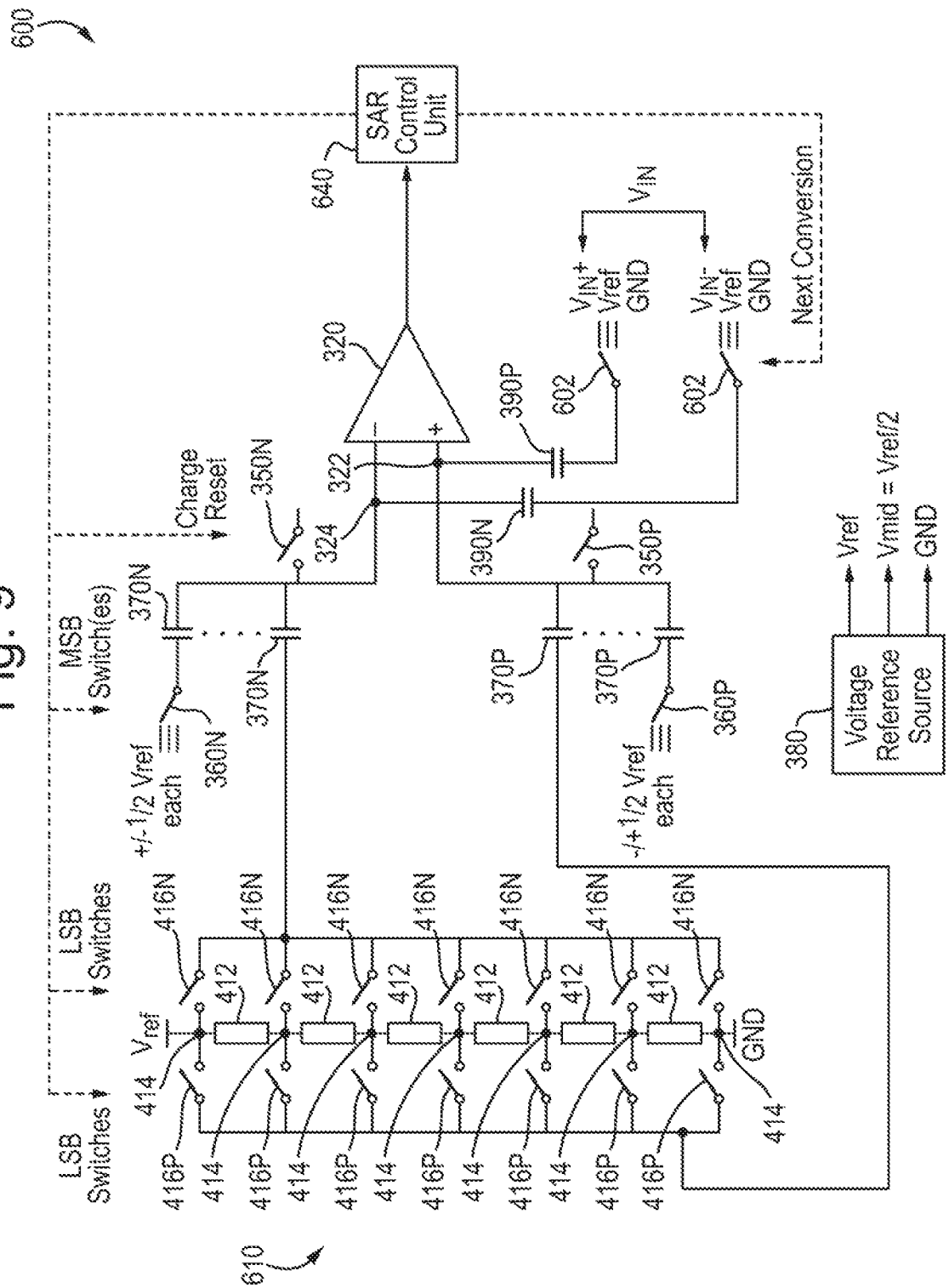
FIG. 9 is a schematic diagram of SAR ADC circuitry embodying the present invention.

FIG. 9 is a schematic diagram of SAR ADC circuitry 600 embodying the present invention, which corresponds closely with the SAR ADC circuitry 400 of FIG. 6 except that the analogue input voltage signal $V_{IN}$ is provided as a differential signal (whereas $V_{IN}$ in FIG. 6 could be considered a single-ended signal).

Thus, as an overview, the analogue input voltage signal $V_{IN}$ is applied between the comparator-input terminals via sampling capacitors 390N and 390P under control of voltage input switches 602 as indicated, by the SAR control unit 640. Each of the comparator-input terminals 322 and 324 then has its own set of capacitors 370 corresponding to those in FIG. 6, but we referred to as "positive" capacitors 370P and "negative" capacitors 370N to indicate that they relate to the "positive" and "negative" components of the differential input voltage signal $V_{IN}$. Corresponding positive capacitor switches 360P and negative capacitor switches 360N are provided for the positive and negative sides of the circuitry, respectively, as are the positive and negative charge reset switches 350P and 350N, respectively.

Also as indicated in FIG. 9, one of the positive capacitors 370P is connected at its second terminal via parallel positive resistor switches 416P to corresponding tapping nodes 414 on the resistive potential divider 610 which corresponds to the resistive potential divider 410 in FIG. 6. One of the negative capacitors 370N is similarly connected at its second terminal via parallel negative resistor switches 416N to corresponding tapping nodes 414 on the resistive potential divider 610. Thus, both the positive and negative sides are equipped similarly to the set up in FIG. 6, controlled by the SAR control unit 640 which corresponds to SAR control unit 440 and thus controls the charge reset switches 350P and 350N, the (MSB) capacitor switches 360P and 360N and the (LSB) resistor switches 416P and 416N.

It will incidentally be understood that in a similar way a differential version of the FIG. 8 circuitry could be provided. However, for simplicity, the differential version of the FIG. 6 circuitry as depicted in FIG. 9 will be explained.

The operation of the SAR ADC circuitry 600 then corresponds to that of the SAR ADC circuitry 400, with operations B1 to B6, except that in the "start" state differing amounts of charge are stored on the positive and negative sides based on applying (at that time) $V_{IN}$ via the input switches 602 and the sampling capacitors 390N and 390P to charge up all capacitances including parasitic capacitances (not shown) at the comparator-input terminals 322 and 324.

In the subsequent operations B1 to B6, the switching applied in the negative side is applied inversely (effectively in the opposite direction) in the positive side. For example, if in one operation a negative capacitor switch 360N switches from $V_{mid}$ to $V_{ref}$ (i.e. ΔV for the capacitor concerned is $+½V_{ref}$) the corresponding positive capacitor switch 360P switches from $V_{mid}$ to GND (i. ΔV for the capacitor concerned is $-½V_{ref}$). Similarly, if a selected tapping point 414 for the negative side moves by +5/20 $V_{ref}$ then the selected tapping point 414 for the positive side moves by -5/20 $V_{ref}$. Note that although the resistive potential divider 510 is depicted with fewer resistors 412 and tapping points 414 than the resistive potential divider 410, this is purely for simplicity in FIG. 9 and the resistive potential divider 610 could be provided with the same arrangement of resistors 412 and tapping points 414 as the resistive potential divider 414 so that the operations B1 to B6 in FIG. 9 have the same relative weights as in FIG. 6 as explained above. Here, it may be noted that, with no impact on the weights relative to each other, the absolute weights are scaled with the ratio of the sampling capacitors 390N, 390P to the sum of all switching and sampling capacitors.

Note that the same resistive potential divider 610 and its tapping points 414 are shared between the positive and negative sides, and this is indeed helpful given the symmetric (albeit inverse) switching pattern between the two sides. Thus, for example, the relative weighting 5:3:2 (i.e. 2.5:1.5: 1) from operations B4 to B6 can be reproduced on both sides symmetrically (with the shared resistive potential divider 610 and especially the shared tapping points 414 laid out symmetrically in terms of potential difference about the $V_{mid}$ point) so that the overall relative weighting (taking into account both sides) is still 5:3:2. However, it is not necessary for the tapping points 414 to be the same for both the positive and negative sides (or, indeed, different resistive potential dividers could be used). For example, the weightings could be asymmetric between the two sides, such as having 3:2:1 for operations B4 to B6 on the positive side and 2:1:1 for operations B4 to B6 on the negative side, still therefore achieving 5:3:2 overall (consider 3:2:1 "plus" 2:1:1), but with a common-mode error between the two sides of 1:1:0 (consider 3:2:1 "minus" 2:1:1), which can be tolerated in the LSBs.

Figure 10:
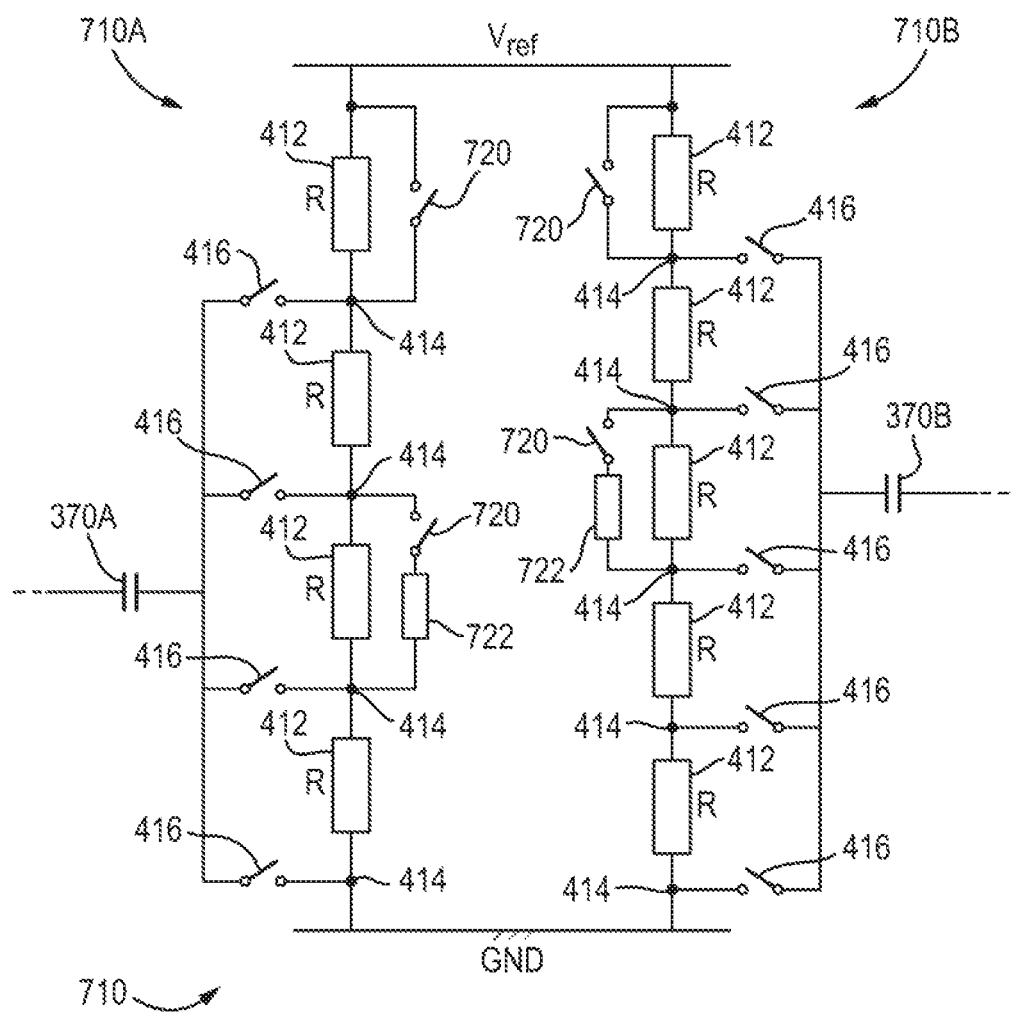
FIG. 10 is a schematic diagram of a resistive potential divider which corresponds to the resistive potential dividers considered in FIGS. 6 to 9.

The ability to have such asymmetry is explored further in FIG. 10 which is a schematic diagram of a resistive potential divider 710 which corresponds to the resistive potential dividers considered above, but which has two sub-dividers 710A and 710B to help demonstrate the possible differences between the tapping points provided to one capacitor 370A and another capacitor 370B.

These capacitors 370A and 370B could be positive and negative capacitors, respectively, corresponding to the positive and negative sides of differential circuitry as in FIG. 9, or they could be two different capacitors 370 connected to the same comparator-input terminal as in FIG. 8. Thus, it will be appreciated that the techniques explored in FIGS. 6 to 10 can be combined in different ways.

The resistive potential divider 710 comprises additional configuration switches 720 and configuration resistors 722. By controlling the configuration switches 720 selectively, it will be appreciated that the number of resistors in the sub-dividers 710A and 710B may be individually controlled, as may the resistances between certain tapping points. By applying these techniques across one or (as in FIG. 10) both sub-dividers 710A and 710B, the performance of those dividers 710A and 710B can effectively be controlled. Note that even with all the configuration switches 720 open the tapping points 414 are different between the dividers 710A and 710B.

By way of summary, the circuitry 400 of FIG. 6 consists of a comparator, a control block and a resistive voltage divider with switches. The resistive voltage divider forms a non-binary weight structure which is defined by the tapping style (how the tapping points are located and accessed). This means that the RDAC (resistive DAC or R-DAC) may consist of unequal or all equal resistors. For example, each of the 2R resistors in FIG. 6 could be replaced by two R resistors in series.

As indicated in FIG. 8, even with a binary-tapped RDAC, a non-binary search similar to that in FIG. 6 can be performed. This works by combining two or more binary RDACs, using multiple RDAC driven capacitors.

Some implementations of this circuit may have an additional CDAC (capacitive DAC or C-DAC). Even if beneficial in many cases, this CDAC is not considered essential. For example, looking back to FIG. 6 a pure RDAC arrangement could be provided if the capacitors 29C, 16C, 9C (hence CDAC) are removed and the capacitor 10C is replaced by a simple wire connection so that the resistive voltage divider 410 is connected directly to node 344. In that case, a "purely resistive" SAR scheme which is non-binary for at least some successive approximation operations could be Implemented by providing appropriate voltages from the resistive voltage divider 410 to the comparator 320 (by operating switches 416 accordingly) for the successive approximation operations. The present disclosure will be understood accordingly.

The circuitry 400 of FIG. 6 acts as a successive approximation (SAR) based ADC. Here, an input signal is compared with an internally generated voltage. Before each conversion, the internally generated voltage has a medium voltage level. Afterwards, the switches are operated for voltage approximation. This works serially: starting with the most significant bit of the MSB down to the least significant bit of the LSB. After each comparator decision, a switch for the corresponding bit is set. FIG. 9 explores an implementation with "differential signalling". FIG. 10 explores the possibility of a tuneable RDAC.

The circuitry discussed above is based on a capacitive-based successive approximation (SAR) ADC, The choice of the capacitors can be binary or a non-binary, but the examples here use a non-binary capacitor structure. The exact dimensioning of the capacitor ratios (and indeed of the capacitors themselves) depends on the application.

Looking back to FIG. 5, the basic CDAC-based non-binary SAR has limited resolution because the smallest capacitor in the CDAC has a value close to the existing parasitic capacitances. This makes capacitance modelling and fabrication difficult. Consequently, the resolution on the ADCs is limited. Also, the necessary charging of the parasitic capacitances might inject an unnecessary high amount of noise to the reference voltage ($V_{ref}$) node. Also, its performance cannot be trimmed for optimal performance, because the weight of the lower bits cannot be adjusted. It's signal to noise ratio may for example be limited by the noise of the comparator.

In contrast, the circuitry of FIGS. 6 to 10 explores using a non-binary RDAC to drive one or multiple CDAC capacitances, using at least two binary RDACs in order to form a non-binary weight structure, making the weights adjustable with help of a configurable RDAC, and using a "half-binary" weight stepping (e.g. only in the LSBs). Also considered is the possibility of "asymmetric" tapping—for example, the comparator noise in-field could be observed and configuration switches such as those in FIG. 10 could be controlled to improve/optimise noise performance.

Using the binary or non-binary RDAC for the lower bits avoids the difficult manufacturing of accurate small capacitances. The charge equalization which takes place in the least significant bits of the SAR process is not using the full swing of the reference voltage. Instead, a smaller voltage step from a resistive voltage divider is used. This allows Keeping the size of capacitances reasonably big. The result is a higher and more stable ADC accuracy—also under variable manufacturing conditions and under restricted pre-silicon modelling. The FIG. 10 configurable RDAC concept allows weight trimming by configurable bypass resistors or shorts in the RDAC. This way, the $\Delta V$ between the lower-bit switches can be tuned for optimal performance. The tuning of $\Delta V$ can compensate eventual variation in manufacturing as well as offset errors on the differential voltage. This may enable a higher ADC accuracy.

If there is SAR-conversion time for one or two extra comparator decisions available, the proposed "half binary" weight structure of FIG. 8 may be considered. For being in the statistical optimum, an effective over at SAR (or Sub-ADC) conversion noise below comparator-noise can be achieved. This "half-binary" approach also outperforms other alternatives, such as repeated comparison with "majority decision". The "half binary" stepping effectively means that the weight is reduced by factor 2 over two decisions rather than over 1 decision as in a binary search. Example LSB weights=(2.82, 2, 1.41, 1). When the comparator's noise and the weight of the last bits are in the same order of magnitude, the "half binary" stepping is appropriate—assuming there is enough conversion time available. This technique may again enable improved ADC accuracy.

Regarding the "asymmetric tapping" concept, if the signalling of the SAR circuit is differential, a small common mode voltage error can be produced by charge equalization that is not 100% symmetric. This can be intended if, for example, existing common mode errors are to be compensated for.

Thus, the main concepts discussed herein include: (1) SAR with CDAC in combination with entirely non-binary R-DAC; (2) SAR with CDAC in combination with partially non-binary R-DAC; (3) non-binary SAR with RDAC; (4) a pure R-DAC-based SAR converter which has some non-binary steps; (5) non-binary RDAC in combination with a binary CDAC; (6) non-binary CDAC-based SAR converter where one capacitor is switching in multiple non-consecutive decisions steps; (7) non-binary CDAC-based SAR converter where for at least one "k" the weights of the decision <k> and <k+2> have a ratio of 2 ("half-binary SAR"); (8) an adjustable RDAC for use in non-binary ADCs (programmable bypass resistors, programmable shorts etc.); and (9)

differential SAR converter with asymmetric charge equalization or assymetric RDAC tapping. Some steps are fully differential and some others are partly single-ended.

Figure 11:
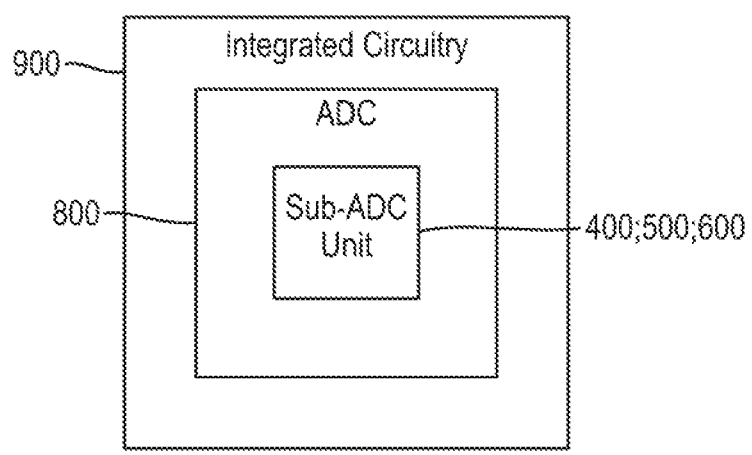
FIG. 11 is a schematic diagram of an integrated circuit 900 embodying the present invention.

FIG. 11 is a schematic diagram of an integrated circuit 900 embodying the present invention. The integrated circuit 900 comprises an ADC circuit 800, which itself comprises any of the SAR ADC circuitry disclosed herein, such as circuitry 400, 500 or 600. It will be appreciated that the circuitry disclosed herein could be described as an ADC.

Circuitry of the present invention may be implemented as integrated circuitry, for example on an IC chip such as flip chip. Thus, the integrated circuit 900 may be an IC chip. The present invention extends to integrated circuitry and IC chips as mentioned above, circuit boards comprising such IC chips, and communicator networks (for example, internet fiber-optic networks and wireless networks) and network equipment of such networks, comprising such circuit boards.

In any of the above aspects, the various method features may be implemented in hardware, or as software modules running on one or more processors. Features of one aspect may be applied to any of the ether aspects. The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an Internet website, or it could be in any other form.

The present invention may be embodied in many different ways in the light of the above disclosure, within the spirit and scope of the appended claims.

The invention claimed is:

1. Analogue-to-digital converter circuitry, comprising:
an analogue input terminal, operable to receive an analogue input voltage signal;
a comparator having first and second comparator-input terminals and operable to generate a comparison result based on a potential difference applied across those terminals; and
successive-approximation control circuitry configured to apply the potential difference across the first and second comparator-input terminals based upon the input voltage signal, and configured to control the potential difference for each of a series of successive approximation operations through charge redistribution, the control applied in each successive approximation operation having a preceding approximation operation being dependent on a comparison result generated by the comparator in that preceding approximation operation,
wherein:
the successive-approximation control circuitry comprises at least two capacitors having first and second terminals, their first terminals being connected to the first or second comparator-input terminal, at least one resistive potential divider connected between high and low reference voltage sources so as to provide a set of different voltage signals at tapping points defined therealong, and switching circuitry; and
the successive-approximation control circuitry is configured such that:
by controlling the switching circuitry in each of a series of N successive said approximation operations OPx, where x=1 to N, a voltage change is applied at the second terminal of at least one said capacitor which is equivalent to an equivalent voltage change $\Delta Vx$ at the second terminal of an equivalent capacitor having an equivalent capacitance $Cx$, each approximation operation having a weight $Wx$ defined by $Cx*\Delta Vx$;
at least a sub-series of the series of approximation operations have a non-binary weight relationship in that a weight ratio from one of those approximation operations to the next $Wx/Wx+1$ is a non-binary ratio in that it is between 1 and 2;
for each of the sub-series of approximation operations, the voltage change $\Delta Vx$ for the approximation operation concerned is effected by controlling the switching circuitry to connect the second terminal of the at least one capacitor concerned from one tapping point along said at least one resistive potential divider to another tapping point along said at least one resistive potential divider;
for at least two of the sub-series of approximation operations, the voltage change $\Delta Vx$ is effected by controlling the switching circuitry to connect the second terminal of the same at least one capacitor concerned from one tapping point along said at least one resistive potential divider to another tapping point along said at least one resistive potential divider; and
for the sub-series of approximation operations, at least one ratio from the capacitance ratio from one of those approximation operations to the next $Cx/Cx+1$ and the voltage change ratio from one of those approximation operations to the next $\Delta Vx/\Delta Vx+1$ is a non-binary ratio.

2. The analogue-to-digital converter circuitry as claimed in claim 1, wherein the successive-approximation control circuitry is configured such that:
the approximation operations of the sub-series of approximation operations comprise applying the respective voltage changes $\Delta Vx$ to the same at least one capacitor concerned, such that the capacitance ratio from one of those approximation operations to the next $Cx/Cx+1$ is 1; and
the voltage change ratio from one of those approximation operations to the next $\Delta Vx/\Delta Vx+1$ is a non-binary ratio.

3. The analogue-to-digital converter circuitry as claimed in claim 2, wherein the successive-approximation control circuitry is configured such that:
each successive approximation operation of the sub-series of approximation operations comprises applying the voltage change $\Delta Vx$ for that operation by connecting the at least one capacitor concerned from one particular tapping point to another;
the particular tapping points comprise:
a starting tapping point;
first and second first-tier tapping points whose voltage levels define a voltage difference $\Delta V1$ above and below a voltage level of the starting tapping point, respectively; and
first and second second-tier tapping points for each of the first-tier tapping, points whose voltage levels define a voltage difference $\Delta V2$ above and below a voltage level of the first-tier tapping point concerned; and
the ratio $\Delta V1/\Delta V2$ is a non-binary ratio.

4. The analogue-to-digital converter circuitry as claimed in claim 3, wherein the particular tapping points are arranged along said at least one resistive potential divider symmetrically about the starting tapping point in terms of their voltage levels.

5. The analogue-to-digital converter circuitry as claimed in claim 2, wherein the successive-approximation control circuitry is configured such that:

each successive approximation operation of the sub-series of approximation operations comprises applying the voltage change ΔVx for that operation by connecting the at least one capacitor concerned from one tapping point to another along the same resistive potential divider as in the preceding approximation operation of the sub-series of approximation operations.

6. The analogue-to-digital converter circuitry as claimed in claim 1, wherein the successive-approximation control circuitry is configured such that:

for the sub-series of approximation operations, the successive approximation operations alternate between applying the voltage change ΔVx for the operation concerned to a first said capacitor or group of said capacitors having an overall capacitance C1 and to a second capacitor or group of said capacitors having an overall capacitance C2, wherein a capacitance ratio C1/C2 is a non-binary ratio, and applying the voltage changes ΔVx for those approximation operations by connecting each capacitor concerned from one, particular tapping point to another along said at least one resistive potential divider, the particular tapping points being defined such that the voltage change ratio from one of those approximation operations to the next ΔVx/ΔVx+1 is a binary ratio in that it is 2.

7. The analogue-to-digital converter circuitry as claimed in claim 6, wherein the particular tapping points comprise:

a starting tapping point;

first and second first-tier tapping points whose voltage levels define a voltage difference ΔV1 above and below a voltage level of the starting tapping point, respectively; and first and second second-tier tapping points for each of the first-tier tapping points whose voltage levels define a voltage difference ΔV2 above and below a voltage level of the first-tier tapping point concerned, wherein the ratio ΔV1/ΔV2 is a binary ratio.

8. The analogue-to-digital converter circuitry as claimed in claim 7, wherein the particular tapping points are arranged along said at least one resistive potential divider symmetrically about the starting tapping point in terms of their voltage levels.

9. The analogue-to-digital converter circuitry as claimed in claim 6, wherein the resistive potential divider used in the sub-series of operations is the same resistive potential divider.

10. The analogue-to-digital converter circuitry as claimed in claim 6, wherein the ratio of C1/C2 is $1/\sqrt{2}$.

11. The analogue-to-digital converter circuitry as claimed in claim 1, wherein the at least one resistive potential divider is defined by resistors between its tapping points, and wherein:

each of the resistors has a resistance which is an integer multiple of a given resistance; and/or the resistors have the same resistance as one another; or at least one of the resistors is a variable resistor, and the control circuitry is configured to control the resistance of that resistor so as to tune the voltage signals provided at the tapping points; or at least one of the resistors is connected in parallel with a bypass circuit, and the control circuitry is configured to control the bypass circuit so as to short-circuit that resistor and tune the voltage signals provided at the tapping points.

12. The analogue-to-digital converter circuitry as claimed in claim 1, wherein:

the voltage change, in each of the series of N approximation operations OPx, is applied at the second terminal of the at least one capacitor or of a group of said capacitors all connected to a particular one of said comparator-input terminals.

13. The analogue-to-digital converter circuitry as claimed in claim 1, wherein the analogue input voltage signal is a differential signal, and wherein:

the voltage change ΔVx, in each of the series of N approximation operations OPx, is applied at the second terminal of a pair of corresponding said capacitors or groups of said capacitors, one of the capacitors or capacitor groups of the pair being connected to the first comparator-input terminal and the other of the capacitors or capacitor groups of the pair being connected to the second comparator-input terminal; and the voltage change, in each of the series of N approximation operations OPx, is applied at the second terminal of corresponding capacitors, that voltage change amounting to the overall voltage change ΔVx at the second terminal of a capacitor having the capacitance Cx.

14. Analogue-to-digital converter circuitry, comprising:

an analogue input terminal, operable to receive an analogue input voltage signal;

a comparator having first and second comparator-input terminals and operable to generate a comparison result based on a potential difference applied across those terminals; and successive-approximation circuitry comprising a digital-to-analogue converter and configured to apply the potential difference across the first and second comparator-input terminals based upon the input voltage signal, and further configured to control the potential difference for each of a series of successive approximation operations, wherein the successive-approximation control circuitry is configured to control the potential difference for each of the series of successive approximation operations so that a half-binary search is performed, the search being half binary in that across the series of successive approximation operations the search from one approximation operation to the next but one constitutes a binary search.

15. Analogue-to-digital converter circuitry, comprising:

an analogue input terminal, operable to receive an analogue input voltage signal;

a comparator having first and second comparator-input terminals and operable to generate a comparison result based on a potential difference applied across those terminals; and successive-approximation control circuitry comprising a digital-to-analogue converter and configured to apply the potential difference across the first and second comparator-input terminals based upon the input voltage signal, and further configured to control the potential difference for each of a series of successive approximation operations, wherein:

the successive-approximation control, circuitry is configured to control the potential difference for each of the series of successive approximation operations so that a non-binary search is performed, the search being non-binary in that across the series of successive approximation operations the search or search range from one approximation operation to the next is weighted between 2:1 and 1:1;

the digital-to-analogue converter comprises a resistive digital-to-analogue converter comprising a resistive potential divider;

tapping points are defined along the resistive potential divider;

the tapping points comprise particular tapping points which define voltage signals for the non-binary search; and the successive-approximation control circuitry is configured to selectively employ voltage signals provided at the particular tapping points in order to carry out the non-binary search.

* * * * *